United States Patent [19]

Glennon et al.

[11] 4,070,665

[45] Jan. 24, 1978

[54] HIGH ACCURACY DIGITAL TO ANALOG RESOLVER CONVERTER

[75] Inventors: William Joseph Glennon, Maplewood, NJ; Alfred Douglas Gronner, White Plains, N.Y.; David Julian Simon, Saddle Brook, N.J.

[73] Assignee: The Singer Company, Little Falls, N.J.

[21] Appl. No.: 690,704

[22] Filed: May 27, 1976

[51] Int. Cl.² .......................................... H03K 13/02
[52] U.S. Cl. ........................ 340/347 SY; 340/347 M; 340/347 CC; 318/569; 318/661; 364/852
[58] Field of Search ........................ 324/158 SY, 130; 340/172.5, 347 M, 347 SY, 347 CC; 235/186; 318/569, 661

[56] References Cited

U.S. PATENT DOCUMENTS

| | | | |
|---|---|---|---|
| 3,395,350 | 7/1968 | Harac | 324/158 SY |
| 3,675,234 | 7/1972 | Metz | 340/347 SY X |
| 3,705,400 | 12/1972 | Cordes | 340/347 M |
| 3,744,050 | 7/1973 | Hedrick | 340/347 SY X |
| 3,763,414 | 10/1973 | Clarke | 340/347 M |
| 3,772,681 | 11/1973 | Skingle | 340/347 M |
| 3,827,045 | 7/1974 | Markus | 340/347 M |
| 3,905,030 | 9/1975 | Lavanant et al. | 340/347 M |
| 3,987,434 | 10/1976 | Endo et al. | 340/347 SY |

OTHER PUBLICATIONS

Scott, *Digital Lag Measurement in Repeat Servo*, IBM Technical Disclosure Bulletin, vol. 1, No. 2, 8/1958, p. 16.
The Engineering Staff of Analog Devices, Inc., *Analog-Digital Conversion Handbook*, 6/1972, pp. I-64 to I-70 & II-143.

*Primary Examiner*—Thomas J. Sloyan
*Attorney, Agent, or Firm*—T. W. Kennedy

[57] ABSTRACT

A high accuracy digital to analog resolver converter uses a read only memory device (PROM) programmed to generate a digital signal proportional to the inherent systematic error of a digital to analog resolver converter. This signal is then converted to analog form by conventional means and combined with the primary signal in analog form thereby substantially increasing the accuracy of a digital to analog resolver converter.

14 Claims, 4 Drawing Figures

OCTANT 1

OCTANT 4

HIGH ACCURACY DIGITAL TO ANALOG RESOLVER CONVERTER

BACKGROUND AND PRIOR ART

This invention relates to an improved digital to analog resolver converter of the type described in pending U.S. Pat. Application Ser. No. 620,740 filed on Oct. 8, 1975, said application having been assigned to the same assignee, The Singer Company, as has this application. The disclosure of U.S. Pat. Application Ser. No. 620,740, is incorporated by reference and made part hereof.

The digital to analog resolver converter uses a conversion technique of approximating sine and cosine functions with linear or chord functions. This approximation results in a systematic error of a magnitude which, for certain purposes, exceeds allowable limits. As a result, an efficient, compact system which would reduce these errors was needed.

The prior art reveals two ways to achieve the necessary converter accuracy. One, precision solid state converters can be constructed utilizing expensive component parts whose combined inaccuracies are within performance objectives. Two, converter performance can be enhanced through error compensation generated by a computer working in conjunction with the converter.

However, both these prior art solutions have serious disadvantages. Precision solid state converters with the desired accuracy are both expensive and bulky. Enhancing converter performance through computer error recognition suffers from the inherent problem of requiring a costly separate computer with available capacity.

SUMMARY OF THE INVENTION

The present invention provides a means for substantially improving the precision in converting digital input to resolver form using fewer discrete parts than required by conventional means. Specifically, it enables the construction of a more accurate yet compact and low cost digital to analog resolver converter of the type described in pending U.S. Pat. Application Ser. No. 620,740.

A digital to analog resolver converter of the type described in U.S. Pat. Application Ser. No. 620,740, uses a digital to analog converter to convert a digital input of $n$ bits to a corresponding analog angle value. This analog angle value is applied to sine and cosine function generators which use bits of the digital input signal to select slope and intercept values for approximating the sine and cosine of the analog angle value. The outputs of these function generators are applied to an octant select circuit, which chooses the values to be used as the sine and cosine of the angle in a particular octant. Two circuits then assign the proper sign to the cosine and sine function values.

The conversion technique approximates non-linear sine and cosine functions with linear or chord functions of the type, $I + M \times B$ where "I" is the intercept, "M" the slope and "B" the normalized distance along the chord. The accuracy of this approximation, in radian, is adequately defined by the formula $E = 0.016 L^3$ where $E$ is the error and $L$ is the chord length in radians. For example, if 22.5° chord lengths are used to approximate the sine and cosine functions, peak errors of approximately ± 3.33 arc minutes will result. This error curve is well defined, being symmetrical about the midpoint of the chord. The predictable nature of the error allows error biasing, as a function of position along the length of the chord thereby reducing the inherent approximation error to about 1.66 arc minutes. An additional error of about 1.5 arc minutes is contributed by the output transformer. Other errors are caused principally by time and temperature effects, resistor tolerances and gain errors.

To reduce these errors to within acceptable limits the invention uses a conventional read only memory device (PROM) operating in the digital section of the converter and programmed to generate a digital signal proportional to the inherent systematic error of the converter. To program the PROM the converter must first be empirically tested and errors versus absolute angle recorded. The PROM can then be programmed to generate a signal carrying the variable correction versus angle.

This signal is then converted to analog form by a conventional digital to analog convertor (DAC) which receives the output of the PROM. The DAC requires only four bit resolution and accuracy since its full scale output is only approximately eight arc minutes. This analog signal is then combined with the primary analog signal and a constant error compensation to make all errors unidirectional, i.e., always negative. In this manner the resulting analog signal will be substantially corrected to compensate for converter error.

This invention has many advantages over the prior art. Principally, it provides a means of achieving high converter accuracy in previously unobtainable compactness and cost. As noted above, precision solid state converters with component parts whose combined inaccuracies are within acceptable limits are costly, bulky and contain may discrete parts. Computer error recognition requires costly and bulky computer capacity.

In a preferred embodiment of the invention $x$ bits of the original $n$ bit digital input representing the magnitude of the desired angle $\theta$ are fed into a 256 × 4 PROM programmed each 0.7031° for 180° since errors are repetitive each $\theta + 180°$. The program is capable of generating a digital signal for the variable correction required for each angle, said corrections having been empirically derived. This signal is converted to analog form by a 4 bit digital to analog converter which receives the output from the PROM and is then combined in a summing amplifier with the primary analog signal and a constant error offset to make all errors in the primary analog signal unidirectional. The result is a corrected signal which produces a conversion from digital to resolver form with accuracy to better than two arc minutes.

This error correction system is in a compact modular form, occupying a space of approximately 3.125 × 2.625 × 0.82 inches and can be implemented by one skilled in the art by using integrated circuits and resistor networks, or in the alternative, by repairable printed circuit construction.

This approach to error correction can be applied to converters used in conjunction with operation of a synchro. It can also be applied to matched converter and resolver (or synchro) pairs. Relatively high accuracy empirical data on the performance of the end items (resolver or synchro) can be gathered using automatic test equipment. The PROM could be programmed to incorporate this empirical data thus eliminating the known majority of error sources in these pairs (e.g., errors to chord approximation and the typical two cycle error curve of the output Scott "T" transformer). In similar fashion, this approach can be expanded to compensate for other external sensor inaccuracies.

DETAILED DESCRIPTION OF FIGS. 1 and 3

Figure 1A:
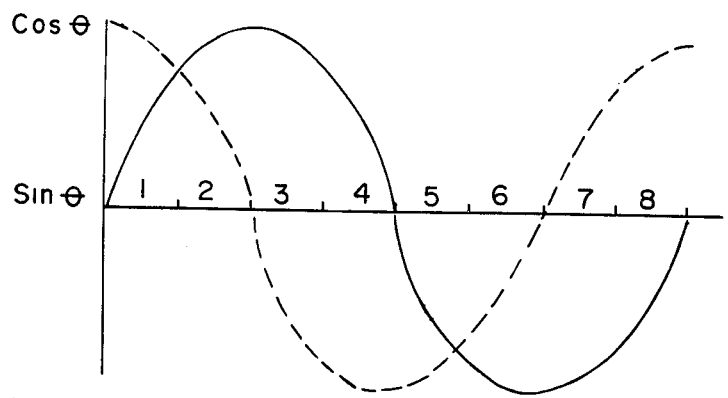
FIG. 1 illustrates the use of two chords according to the invention described in pending U.S. Pat. Application Ser. No. 620,740, to approximate the sine and cosine functions over a 45° range (one octant) and systematic error generated thereby.

FIG. 1(a) shows the values of the sine and cosine functions over a 360° range. This 360° range is divided into four odd numbered octants (I, III, V, and VII) and four even numbered octants (II, IV, VI and VIII).

Figure 1B:
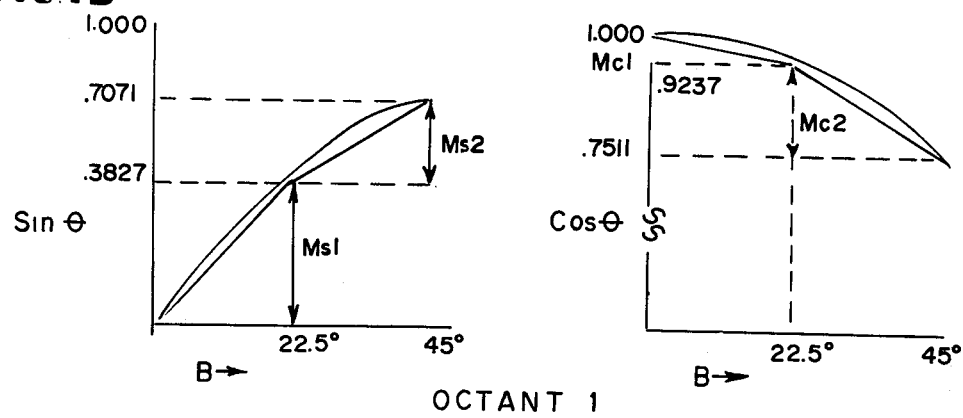

FIG. 1(b) shows the use of two chords to approximate the values of the sine and cosine function in an odd numbered octant (I).

Figure 1C:
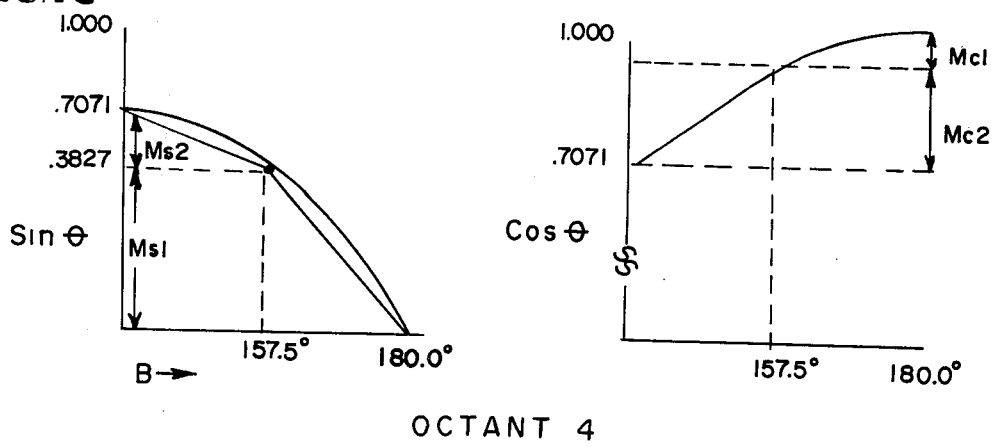

FIG. 1(c) shows the use of two chords to approximate the values of the sine and cosine function in an even numbered octant (IV). From FIGS. 1(b) and 1(c), the inherent error which result from the sine and cosine approximations using chords is evident.

Figure 2:
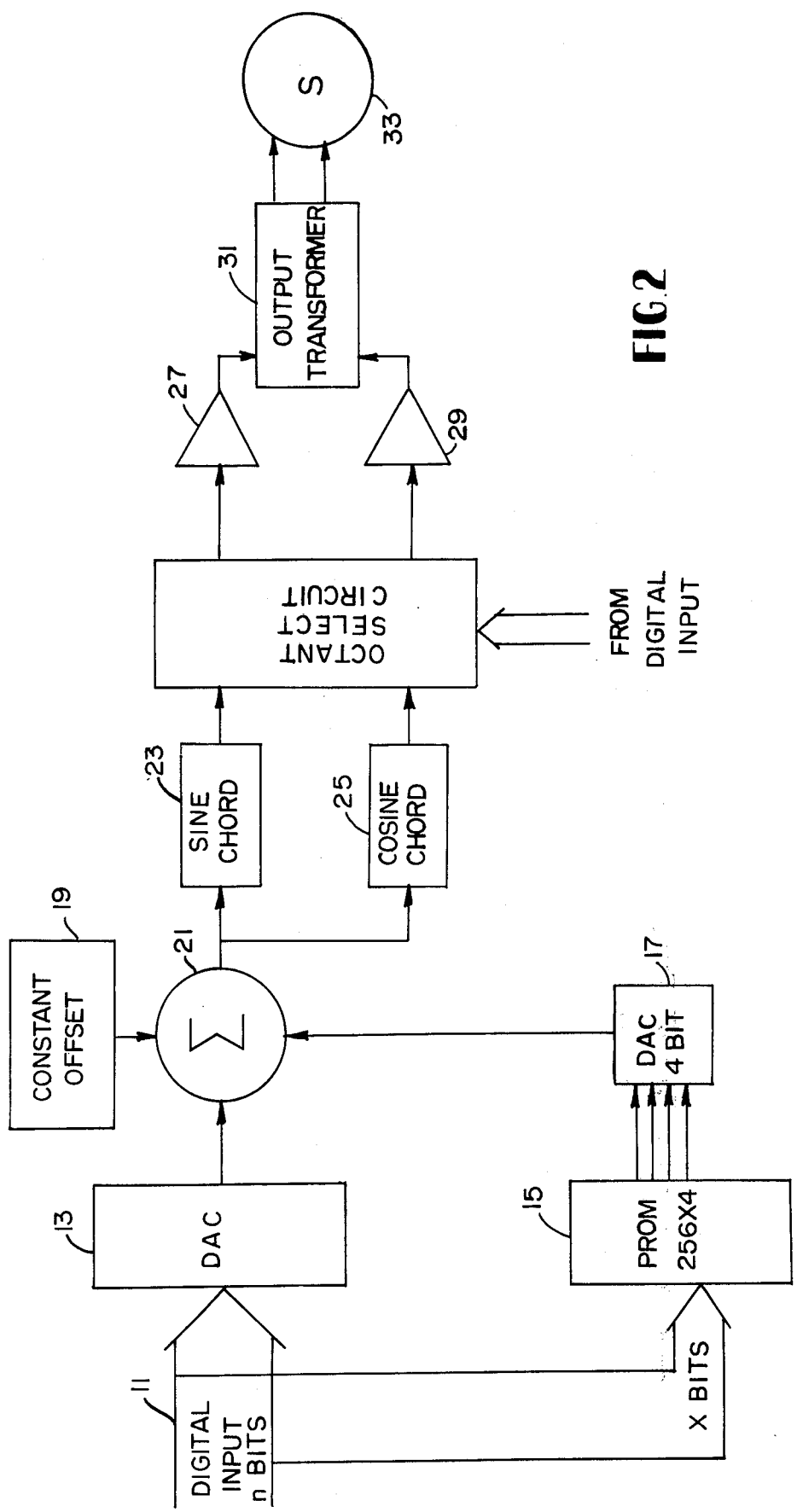
FIG. 2 is a diagram of the preferred embodiment of the invention.

FIG. 2 illustrates, in block diagram form an embodiment of the present invention which permits correcting for the errors. The digital input to be converted is shown as an input 11 to a digital to analog converter 13. Four of these bits in the present embodiment are provided to a programmable read only memory 15 capable of storing 256 four bit words. In conventional fashion in accordance with the digital input, the programmable read only memory 15 provides a four bit output which is supplied to a four bit digital to analog converter 17. Stored within the programmable read only memory is data of an empirical nature representing the error in the system which is determined in a manner to be described more fully below. As noted above, in order to insure that all error correction is in one direction, a constant offset signal is generated. This can be done using a potentiometer or other similar device and is indicated on the block diagram of FIG. 2 by a constant offset block 19. The analog output of the digital to analog converter along with the constant offset and output of the digital to analog converter 17 are provided to a summing junction 21. The output from this summing junction is provided to the sine chord computation means 23 and cosine chord computation means 25. These outputs are then provided to an octant select circuit where the proper one is selected as sine or cosine in accordance with the aforementioned, copending application. In this circuitry also the proper sign is applied to the sine and cosine. The outputs, after being coupled through power amplifiers 27 and 29 respectively, are provided as inputs to an output transformer 31 from which the final resolver output is provided. If a synchro output is desired, this will be a conventional Scott T transformer. The outputs provided from the transformer, presuming a Scott T transformer, are then coupled to a synchro 33.

The data which is stored in the programmable read only memory 15 can correct simply the error which results from the chord approximation shown on FIGS. 1(b) and 1(c). In other words, for each increment of the four bits provided to the programmable read only memory the calculated difference between a chord approximation and the actual value of sine or cosine can be stored in the programmable read only memory. However, a more accurate approximation is obtained by, after constructing the apparatus, measuring the outputs from the output transformer for each digital input value and determining the error. Once this error is determined it is entered into the programmable read only memory so that errors not only due to the chord approximation but due to inaccuracies in the system along with transformer errors will also be corrected. Finally, it is also possible to measure the output of a synchro coupled thereto and determine the synchro angular errors and correct accordingly. This permits supplying a matched converter and synchro with an extremely high degree of accuracy.

A number of units were constructed in accordance with the present invention. All of these units were found to have better than two arc minutes of accuracy. Table 1 below illustrates the manner in which programming was done. In the lefthand column labeled line number the test number is recorded. Next to this is the angular input. Next is the switch position or the binary bit which were provided to the converter. This is designated as switch position since during the test, switches were used to simulate the binary input. The next column is the reading obtained as the output of the converter using an appropriate bridge, the next column the error in degrees and the final columns the correction placed in the programmable read only memory. Only 30 lines of data covering angles from 0 to 21.093 are given. Naturally, the test was carried out for a full 256 lines of data, the capacity of the PROM. After obtaining this information, the PROM was programmed and the results were as given in Table 2 below. Here, 20 tests were run at various angles with the desired output shown next to the actual output. It is evident, that in each case an output within two arc minutes was obtained.

TABLE I

| LINE NO. | INPUT | SWITCH POSITIONS | BRDG READINGS | DEG | .088 | .044 | .022 | .011 |
|---|---|---|---|---|---|---|---|---|
| 0 | 0.0 |  | 359.913 | 087 | 1 | 0 | 0 | 0 |
| 1 | .703 | $2^9$ | 594 | 109 | 1 | 0 | 1 | 0 |
| 2 | 1.406 | $2^8$ | 282 | 124 | 1 | 0 | 1 | 1 |
| 3 | 2.109 | $2^8, 2^9$ | 972 | 137 | 1 | 1 | 0 | 0 |
| 4 | 2.812 | $2^7$ | 670 | 142 | 1 | 1 | 0 | 1 |
| 5 | 3.515 | $2^7, 2^9$ | 366 | 149 | 1 | 1 | 1 | 0 |
| 6 | 4.218 | $2^7, 2^8$ | 066 | 152 | 1 | 1 | 1 | 0 |
| 7 | 4.921 | $2^7, 2^8, 2^9$ | 767 | 154 | 1 | 1 | 1 | 0 |
| 8 | 5.625 | $2^6$ | 464 | 161 | 1 | 1 | 1 | 1 |
| 9 | 6.328 | $2^6, 2^9$ | 169 | 159 | 1 | 1 | 1 | 0 |
| 10 | 7.031 | $2^6, 2^8$ | 877 | 154 | 1 | 1 | 1 | 0 |
| 11 | 7.734 | $2^6, 2^8, 2^9$ | 585 | 149 | 1 | 1 | 1 | 0 |
| 12 | 8.437 | $2^6, 2^7$ | 300 | 137 | 1 | 1 | 0 | 0 |
| 13 | 9.140 | $2^6, 2^7, 2^9$ | 010 | 130 | 1 | 1 | 0 | 0 |
| 14 | 9.843 | $2^6, 2^7, 2^8$ | 722 | 121 | 1 | 0 | 1 | 1 |
| 15 | 10.546 | $2^6, 2^7, 2^8, 2^9$ | 434 | 112 | 1 | 0 | 1 | 0 |

TABLE I-continued

| LINE NO. | INPUT | SWITCH POSITIONS | BRDG READINGS | DEG | .088 | .044 | .022 | .011 |
|---|---|---|---|---|---|---|---|---|
| 16 | 11.250 | $2^5$ | 152 | 098 | 1 | 0 | 0 | 1 |
| 17 | 11.953 | $2^5, 2^9$ | 865 | 088 | 1 | 0 | 0 | 0 |
| 18 | 12.656 | $2^5, 2^8$ | 578 | 078 | 0 | 1 | 1 | 1 |
| 19 | 13.359 | $2^5, 2^8, 2^9$ | 290 | 069 | 0 | 1 | 1 | 0 |
| 20 | 14.062 | $2^5, 2^7$ | 005 | 057 | 0 | 1 | 0 | 1 |
| 21 | 14.765 | $2^5, 2^7, 2^9$ | 715 | 050 | 0 | 1 | 0 | 1 |
| 22 | 15.468 | $2^5, 2^7, 2^8$ | 425 | 043 | 0 | 1 | 0 | 0 |
| 23 | 16.171 | $2^5, 2^7, 2^8, 2^9$ | 133 | 038 | 0 | 1 | 0 | 0 |
| 24 | 16.875 | $2^5, 2^6$ | 833 | 042 | 0 | 1 | 0 | 0 |
| 25 | 17.577 | $2^5, 2^6, 2^9$ | 537 | 040 | 0 | 1 | 0 | 0 |
| 26 | 18.280 | $2^5, 2^6, 2^8$ | 241 | 039 | 0 | 1 | 0 | 0 |
| 27 | 18.983 | $2^5, 2^6, 2^8, 2^9$ | 941 | 042 | 0 | 1 | 0 | 0 |
| 28 | 19.686 | $2^5, 2^6, 2^7$ | 644 | 042 | 0 | 1 | 0 | 0 |
| 29 | 20.389 | $2^5, 2^6, 2^7, 2^9$ | 340 | 049 | 0 | 1 | 0 | 0 |
| 30 | 21.093 | $2^5, 2^6, 2^7, 2^8$ | 034 | 059 | 0 | 1 | 0 | 1 |

TABLE II
ANGULAR ACCURACY

| TEST | DIGITAL INPUT (HI) AT FOLLOWING MSB'S (ALL OTHER DIGITAL INPUTS AT D. C. COMMON) | RESOLVER OUTPUT DEGREES (± 0.033) | |
|---|---|---|---|
| 1 | ALL DIGITAL INPUTS AT DC COMMON | 0.000 | 0.001 |
| 2 | 6th | 5.625 | 5.620 |
| 3 | 6th thru 15th | 11.239 | 11.255 |
| 4 | 5th | 11.250 | 11.250 |
| 5 | 4th | 22.500 | 22.498 |
| 6 | 3rd | 45.000 | 44.979 |
| 7 | 3rd, 4th | 67.500 | 67.485 |
| 8 | 2nd | 90.000 | 89.999 |
| 9 | 2nd, 4th | 112.500 | 112.500 |
| 10 | 2nd, 3rd | 135.000 | 134.999 |
| 11 | 2nd, 3rd, 4th | 157.500 | 157.496 |
| 12 | 1st | 180.000 | 179.899 |
| 13 | 1st, 4th | 202.500 | 202.485 |
| 14 | 1st, 3rd | 225.000 | 225.003 |
| 15 | 1st, 3rd, 4th | 247.500 | 247.510 |
| 16 | 1st, 2nd | 270.000 | 269.983 |
| 17 | 1st, 2nd, 4th | 292.500 | 292.493 |
| 18 | 1st, 2nd, 3rd | 315.000 | 315.004 |
| 19 | 1st, 2nd, 3rd, 4th | 337.500 | 337.503 |
| 20 | 1st, 2nd, 3rd, 5th | 348.750 | 348.756 |

Thus, the present invention provides a high accuracy, digital to resolver or synchro converter using relatively inexpensive components obtaining from what was previously a rough approximation device high accuracy.

Although specific embodiments of the invention have been illustrated and described, it will be obvious to those skilled in the art that various modifications may be made without departing from the spirit of the invention which is intended to be limited solely by the appended claims.

What is claimed is:

1. A method for enhancing the accuracy of a digital to analog resolver converter of the type which first converts a primary $n$ bit digital input to a corresponding analog value and then converts the analog value to outputs for resolver use having a known variable error for each desired angle comprising the steps:
   a. storing in a read only memory device having a $y$ bit output the known variable error for each desired angle;
   b. addressing the read only memory device with the bits of the primary $n$ bit digital input representing the magnitude of each desired angle;
   c. converting the output of the read only memory device to analog form with a digital to analog converter;
   d. summing the variable error output converted to analog form and analog value of the primary digital input resulting in a corrected signal; and
   e. using said corrected signal to develop the outputs for resolver use corresponding to each desired angle.

2. The method of claim 1 wherein said converter uses a chord approximation technique and said known variable error for each desired angle is derived by computing the error for each desired angle due to the chord approximation technique for approximating sine and cosine functions.

3. The method of claim 1 wherein said known variable error for each desired angle is derived by measuring the output for resolver use for each desired angle.

4. The method of claim 1 and further including coupling a resolver to said outputs and wherein said known variable error for each desired angle is derived by measuring the resolver shaft output for each desired angle.

5. The method of claim 1 and further including coupling a Scott T transformer to said outputs and wherein said known variable error for each desired angle is derived by measuring the output of the Scott T transformer for each desired angle.

6. The method of claim 5 and further including coupling a synchro to said Scott T transformer and wherein said known variable error for each desired angle is derived by measuring the shaft angle of synchro for each desired angle.

7. The method of claim 1 wherein a constant error offset to make errors unidirectional is also summed with the variable error output converted to analog form and the analog value of the primary digital input.

8. A device for enhancing the accuracy of a digital to analog resolver converter of the type in which a first digital to analog converter converts a primary $n$ bit digital input to a corresponding analog value and then converts the analog value to resolver outputs having a known variable error for each desired angle which comprises:
   a. a read only memory device having its address inputs coupled to the bits of the primary $n$ bit digital input representing the magnitude of each desired angle and having been programmed with the known variable error for each desired angle and having a $y$ bit output containing the known variable error for each angle;
   b. a second digital to analog converter having its inputs coupled to the outputs of said read only memory device and having as its output the variable error for each desired angle in analog form;
   c. means, having as inputs the outputs of said first and second digital to analog converters, for summing the known variable error for each desired angle and the analog value of the primary digital input which results in a corrected signal said signal then being used in said converter for generating said outputs for resolver use corresponding to each desired angle.

9. The device of claim 8 and further including means to provide a constant error offset to make errors unidirectional coupled to said means for summing whereby said offset is summed with the variable error for each desired angle and the analog value of the primary digital input.

10. In a digital to analog resolver converter comprising:
   a. a first digital to analog converter having as inputs a primary $n$ bit digital signal; and
   b. means to convert the output of said first digital to analog converter to resolver outputs having a known variable error for each angle, the improvement comprising:
   c. a read only memory device having its address inputs coupled to the bits of the primary $n$ bits digital input representing the magnitude of each desired angle and having been programmed with the known variable error for each desired angle and having a $y$ bit output containing the known variable error for each angle;
   d. a second digital to analog converter having its inputs coupled to the outputs of said read only memory device and having as its output the variable error for each desired angle in analog form;
   e. means, having as inputs the outputs of said first and second digital to analog converters, for summing the known variable error for each desired angle and the analog value of the primary digital input which results in a corrected signal which signal is provided to said means to convert.

11. A device as in claim 10, wherein said means to convert comprises:
   a. means to approximate a sine function,
   b. means to approximate cosine function,
   c. an octant select means, and
   d. sign select means.

12. The digital to analog resolver converter of claim 10 and further including means to provide a constant error offset to make errors unidirectional which offset is coupled as an additional input to said summing means.

13. The digital to analog resolver converter of claim 10 further including a resolver coupled to the output of said means to convert.

14. The digital to analog resolver converter of claim 10 further including a Scott T transformer and synchro for synchro operation coupled to its output.

* * * * *